United States Patent

[11] 3,577,194

[72] Inventor Donald L. Beall
Syracuse, N.Y.
[21] Appl. No. 788,867
[22] Filed Jan. 3, 1969
[45] Patented May 4, 1971
[73] Assignee General Electric Company

[54] ANALOG TO DIGITAL CONVERSION CIRCUIT
4 Claims, 4 Drawing Figs.

[52] U.S. Cl. 340/347AD, 340/347NT
[51] Int. Cl. H03k 13/02
[50] Field of Search 340/347

[56] References Cited
UNITED STATES PATENTS

| | | | |
|---|---|---|---|
| 3,439,271 | 4/1969 | Metcalf | 340/347 |
| 3,439,272 | 4/1969 | Barley | 340/347 |
| 3,471,687 | 10/1969 | Pullen | 340/347 |
| 3,483,550 | 12/1969 | Max | 340/347 |

*Primary Examiner*—Thomas A. Robinson
*Assistant Examiner*—Jeremiah Glassman
*Attorneys*—Norman C. Fulmer, Carl W. Baker, Frank L. Neuhauser, Oscar B. Waddell and Melvin M. Goldenberg

ABSTRACT: An analog-to-digital conversion circuit is disclosed, which converts a varying analog signal to the nearest available digital value by the successive approximation technique. The circuit includes a summing mode for the analog and various digital voltages, followed by a chopper switch, AC amplifier, sample-and-hold circuit, voltage comparator, and digital approximation control circuits. The advantageous results are high speed, excellent resolution and accuracy, and low drift characteristics.

INVENTOR:
DONALD L. BEALL,

BY Norman C. Fulmer
HIS ATTORNEY.

ANALOG TO DIGITAL CONVERSION CIRCUIT

BACKGROUND OF THE INVENTION

The invention is in the field of electronic circuits for converting varying analog signals into discrete digital signal values.

When analog signals are to be fed to or utilized by digital devices such as computers, the analog signal must be converted to a succession of digital signals having values which the digital device is capable of utilizing. In the widely used successive approximation technique of analog-to-digital conversion the value of the analog signal at a given time is rapidly compared with certain of the available digital values until the closest "match" is found, and this closest digital value is fed out of the analog-to-digital converter. This comparison procedure is repeated at desired time intervals to provide a succession of digital values closely representative of the varying analog signal. The comparison procedure is usually performed in a logical manner so as to arrive at the nearest digital value in the shortest time, by employing the fewest possible number of comparison steps; that is, the analog signal value at a given time is first compared with the centermost or "halfway" digital value; then with the ¼ or ¾ digital value depending on whether the first comparison found the analog value to be smaller or greater than the ½ digital value; the next comparison will be with the ⅛, ⅜, ⅝ or ⅞ digital value, etc., until the finest digital incremental value has been reached. The formula for closeness of the approximation of the digital value to the analog value reached by the foregoing procedure is $1/2^n$ where $n$ is the number of comparison cycles. Thus, with 10 cycles of comparison the selected digital value will be within 1/1024 of the analog value.

One type of analog-to-digital circuit applies the value of a sampled and held analog signal, at a given time, to a "summing node" point and rapidly applies a sequence of digital values to the summing node point with an electrical polarity opposite that of the analog signal. Thus, if the summing node voltage is zero it is known that the analog and digital signal values are equal; if negative it is known that the digital value is smaller than the analog value (assuming, in this example, that the analog signal is negative and the digital signal is positive); and, if positive, it is known that the digital value is larger than the analog value. A comparator circuit continuously compares the summing node voltage with the electrical ground or zero potential and produces a series of control signals indicative of whether the summing node voltages is positive or negative. These control signals actuate a digital signal circuit for applying various digital values to the summing node point, in the logical manner described above so that, for example, in 10 cycles of digital comparisons a digital value is found that is closer to the analog value than one-thousandth part of the range of digital values. The closest match of digital-to-analog values is obtained when the voltage at the summing node point is at or near zero.

In analog-to-digital converters, such as the types described above, it usually is necessary to amplify the analog and digital values so as to obtain large enough voltage values for making accurate comparisons in the comparator circuit. Direct-coupled amplifiers are required in order to maintain the relationships of the amalog and digital values and electrical ground or zero reference potential. It is relatively difficult to design direct-coupled amplifiers, as compared to AC amplifiers, so as to be high gain, broadband and free from DC drift for functioning properly and accurately in analog-to-digital converters. Another problem involved in the design of analog-to-digital converters, is that precautions must be taken to ensure that transient voltages, such as are produced when different digital values are switched into the circuit, will not adversely affect the functioning of the comparator circuit.

SUMMARY OF THE INVENTION

Objects of the invention are to provide an improved analog-to-digital conversion circuit and to solve or diminish the prior art problems described above.

The invention comprises, briefly and in a preferred embodiment, an analog-to-digital converter circuit having a summing node point to which the analog signal and selected digital signal values are fed with relatively opposite electrical polarities. A chopper switch device repetitively connects the summing node point to a reference potential such as electrical ground. An AC amplifier is connected to the summing node and the amplified signal is applied to a sample-and-hold circuit which operates to perform the sampling in synchronism with the ON times of the chopper switch, so as to sample and hold the reference potential. A comparator circuit compares the amplifier output signal with the reference potential value being held by sample-and-hold circuit and produces an output control signal indicative of whether the amplified signal is of positive or negative polarity with respect to the reference value being held in the sample-and-hold circuit. The output control signal is applied to a digital logic control circuit, which may comprise a parallel storage register, which logically selects the next digital value to be applied to the summing node point. The procedure is repeated a certain number of cycles (10 cycles, for example) until the available digital value nearest to the analog value has been determined by the technique of successive approximation. The invention, through the cooperative combination of a chopper switch and a sample-and-hold circuit, permits the use of an AC amplifier instead of a DC amplifier as required in the prior art, and therefore achieves a high degree of reliability and accuracy without the problems of drift, instability and bandwidth associated with the use of DC amplifiers. The invention also prevents undesired effects from being caused by transient switching signals. This is achieved by the functioning of the chopper switch which short circuits the stray capacitance at the summing node point at times when the switching transients would occur.

DESCRIPTION OF THE PREFERRED EMBODIMENT

Figure 1:
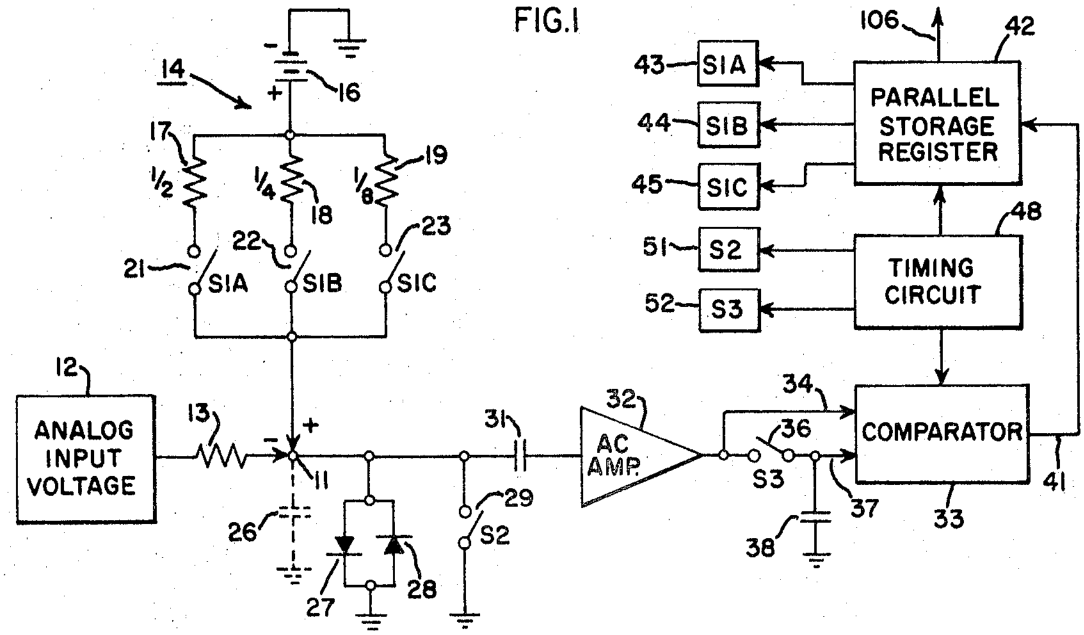
FIG. 1 is an electrical diagram, in block and schematic form, of a preferred embodiment of the invention.

In the circuit of FIG. 1, a summing node point 11 has an analog signal input voltage source 12 connected thereto via a resistor 13. A source 14 of digital input comparison signals is connected to the summing node point 11, and comprises a DC precision reference voltage source 16 having the negative polarity terminal thereof electrically grounded and having the positive polarity terminal thereof connected to the ends of a plurality of resistors 17, 18, and 19. A multiple section switch S1 has sections 21, 22, and 23 thereof connected to respectively connect the remaining ends of the resistors 17, 18, and 19 to the summing node point 11, either individually or in combinations thereof. Although three resistors and switch sections are shown, more are preferred in actual practice. For convenience, the switch sections are designated as S1A, S1B, and S1C.

Stray capacitance 26 exists between the summing node point 11 and electrical ground. A pair of diodes 27 and 28 are connected in parallel, with mutually opposite polarity orientation, between the summing node point 11 and electrical ground. A chopper switch 29, designated for convenience as S2, is connected between the summing node point 11 and electrical ground. A coupling capacitor 31 is connected between the summing node point 11 and the input of an AC amplifier 32, the output of which is connected to a first input of a comparator circuit 33 by means of an input connection 34. The output of the amplifier 32 also is connected, via a switch 36, designated for convenience as S3, to a second input connection 37 of the comparator circuit 33. A sample-and-hold capacitor 38 is connected between the second comparator input 37 and electrical ground. The output 41 of the comparator 33 is fed to the input of a parallel storage register control circuit 42 the output of which is connected to the actuation means 43, 44, 45 of the digital signal control switches S1A, S1B, and S1C. A timing circuit 48 is connected to timing inputs of the parallel storage register 42 and the comparator 33, and also is connected to the actuators 51 and 52 of the chopper switch S2 and the sampling switch S3.

Figures 2, 3, 4:
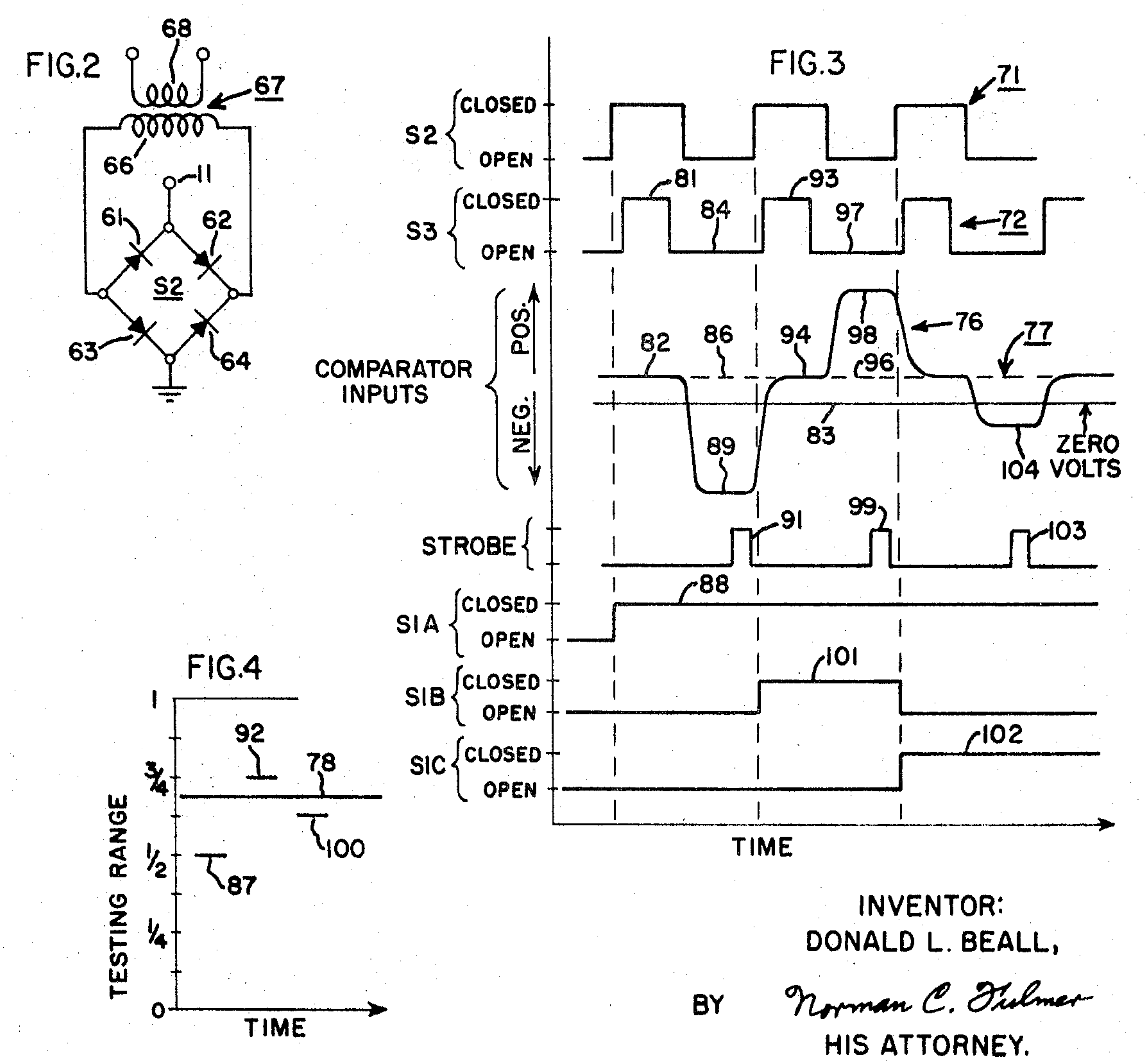
FIG. 2 is a schematic diagram of a diode switch circuit for use in the circuit of FIG. 1.
FIG. 3 is a plot with respect to time of various signals that occur in the circuit of FIG. 1.
FIG. 4 is a representation with respect to time of the successive approximation technique of analog-to-digital conversion.

The switches S1, S2, and S3 may comprise transistor or diode switching arrangements. The switch S2 preferably comprises a diode quad switch as shown in FIG. 2, comprising four diodes 61, 62, 63 and 64 in a bridge arrangement, one arm of the diode bridge being connected between the summing node point 11 and electrical ground, and the other arm thereof being connected across the secondary winding 66 of a control transformer 67 to the primary winding 68 of which is fed actuating signals from the timing circuit 48. When the actuating signal is one polarity across the secondary 66, all four diodes are rendered conductive and the switch S2 is ON; when the actuating signal is the reverse polarity all four diodes are nonconductive and the switch S2 is OFF.

The operation of the circuit of FIG. 1 will now be described with reference to the signals shown in FIG. 3. The analog input voltage from source 12, and the digital comparison signals from source 14, are applied to the summing node point 11 with mutually opposite polarities, the analog voltage being of negative polarity and the digital voltage values being of positive polarity in the example shown. For each sequence of successive approximation for finding the nearest digital value to the analog voltage value, the timing circuit 48 causes the chopper switch S2 to turn on and off for a given number of cycles, as indicated by the curve 71 in FIG. 3. Three cycles of operation are illustrated; however, in actual practice 10 cycles of operation are generally employed. The sampling switch S3 is actuated, under control of the timing circuit 48, so as to be ON during a portion of each ON period of the chopper switch S2, as indicated by the curve 72. During the times when chopper switch S2 is on, the summing node point 11 is electrically grounded, Thus, at the time the sampling switch S3 is on, a reference potential as provided at the output of amplifier 32 is applied to the capacitor 38, where it is held during the intervals when switch S3 is open. If the amplifier 32 were a DC amplifier, as in the prior art arrangements, its output would be electrical ground zero when the chopper switch S2 is on, and its output would be fed directly to an input 37 of the comparator 33, and the other comparator input 34 would be connected to electrical ground or zero potential. In the arrangement of the invention as shown in FIG. 1, the voltage that is sampled and held on the capacitor 38 is not necessarily zero potential; very likely it is a potential above or below zero, since the AC amplifier 32 is not capable of maintaining a fixed reference potential, such as electrical ground zero, from input to output thereof. As will be explained more fully, the invention, by the cooperative functioning of the chopper switch S2, the AC amplifier 32, the sample-and-hold circuit 36, 38, and the comparator 33, achieves accurate signal comparisons for proper functioning of the successive approximation technique.

The third curve of FIG. 3 shows the two inputs to the comparator circuit 33 for 3 cycles of operation of the circuit, the solid line curve 76 being the signal at the first comparator input 34, and the dashed line curve 77 being the signal at the second comparator input 37. The chopper switch S2 operates sufficiently rapidly so that for the purposes of the invention the input signal to the AC amplifier 32 is an alternating signal which can be accurately amplified by the amplifier 32.

Now referring to FIG. 4, it is assumed for this example of operation that the analog input voltage from source 12 is a value indicated by the line 78, which lies between ⅝ and ¾ of the analog-to-digital conversion range as set out on a scale from zero to one.

A sequence of the first 3 cycles of operation will now be described, with reference to FIGS. 3 and 4. During the first sampling interval, at which time the switch S3 is closed as indicated by numeral 81 in FIG. 3, the chopper switch S2 also being closed at this time, the input to the capacitor 31 will be electrical ground zero voltage, and the output of the amplifier 32 which is applied to the sample-and-hold capacitor 38 is a nominal zero or average value as indicated by numeral 82; this nominal zero output of the AC amplifier 32 is not necessarily the same as true zero potential of the circuit as indicated by the line 83 in FIG. 3. It is a well known characteristic of AC amplifiers that the average or nominal zero output thereof will be at the average or zero level with respect to the positive and negative excursions of the amplified output signal 76, and this average value may vary with respect to time. During the subsequent holding period, during which time the switch S3 is open as is indicated by numeral 84, the chopper switch S2 is open, and the reference voltage charge 82 on capacitor 38 will be held as indicated by the dashed line 86. As is well-known procedure in the successive approximation technique, during this time the first digital comparison value as determined by the switch S1 is set, under control of the circuit 42, at its most significant bit or "halfway value" as indicated by the line 87 in FIG. 4. This digital comparison value is achieved by the switch S1A being closed as indicated by line 88 in FIG. 3. Since, in the example shown, the analog value 78 is relatively a greater negative value than is the positive value 87 of the digital sampling voltage, at the summing node 11, the amplified voltage at comparator input 34 will be a negative value as indicated by numeral 89 in FIG. 3. Thus, at this time, the first comparator input 34 will have the negative voltage 89, and the second comparator input 37 will have the reference voltage value 86. The comparator 33, upon command of a strobe pulse 91 generated in the timing circuit 48, produces a voltage pulse, a digital 1 for example, to indicate that the comparison of the two inputs thereof indicates that the next logical digital sampling voltage (second most significant bit) shall be at a higher level from the halfway value. This next higher value logical digital reference level will be the ¾ voltage level as indicated by numeral 92 in FIG. 4, and the parallel storage register control circuit 42 then sets the digital sampling circuit 14 so that switch sections S1A and S1B are closed as indicated by the curves 88 and 101 in FIG. 3.

During the next sample interval as indicated by numeral 93, the sampling capacitor 38 is charged to the AC amplifier output zero reference potential as indicated by numeral 94, and this value is held as indicated by the dashed line 96 during the subsequent holding period 97. During this interval the amplified voltage of the summing node point 11 is a positive value as indicated by numeral 98, since the digital sampling voltage 92 is a greater positive value than is the negative value 78 of the analog voltage. Upon the occurrence of the second strobe pulse 99, the comparator senses the relative positive voltage 98 as compared to the reference voltage 96, and generates an appropriate signal, such as a digital 0, over line 41 to the parallel storage register control circuit 42 which functions in well-known manner to cause the switch sections of switch S1 to select the next logical comparison value, i.e., the value at ⅝ of the testing range, as indicated by numeral 100 in FIG. 4. This value of digital comparison voltage is achieved by closing switch sections S1A and S1C, as indicated by numerals 88 and 102 in FIG. 3. The foregoing cyclic procedure is repeated, and upon occurrence of the third strobe pulse 103 the summing node voltage has a negative value; thus an amplified negative voltage 104 is applied to the comparator 33, along with the reference potential held on capacitor 38, whereupon the comparator 33 generates a digital 1 pulse thus indicating to the control circuit 42 that the next logical digital value should be greater than the preceding value. Thus, in 3 cycles of successive approximation, the circuit has arrived within ⅛ of the correct digital value of the analog input voltage value 78. In a preferred arrangement, there would be 10 cycles of successive approximation, which would determine the nearest digital value within one-thousandth of the analog voltage value. The closest digital value to the analog value, as determined by the foregoing successive approximation technique, is read out from the parallel storage register 42 at an output 106 thereof. The sequence of cyclic comparison is repeated automatically, or at selected time intervals, in order to generate a series of digital values which closely approximate the varying voltage of the analog input signal.

The pair of diodes 27 and 28 in FIG. 1 function to ensure that the voltage at the summing node point 11 does not deviate so far from zero voltage as would require slowing down the speed of circuit operation.

From the foregoing description, it is seen that the invention, through the cooperative functioning of the chopper switch S2, the amplifier 32, sample-and-hold circuit 36, 38, and comparator 33, functions to achieve fast and accurate analog-to-digital conversion, with the use of an AC amplifier 32 which is relatively simple, inexpensive, and reliable as compared with the DC amplifiers required in prior art circuits. The invention is also useful with a DC amplifier in place of the AC amplifier 32, in which case the DC amplifier need not be as stable and drift-free as in the prior art analog-to-digital circuits, since each digital vs, analog comparison is made with respect to a sampled and held reference value.

The cycle comparison functioning of the circuit is so rapid that a typical analog input signal from the source 12 would appear to be a relatively constant value, as indicated by the analog voltage line 78 in FIG. 4, during the sequence of comparisons. For example, the chopper switch S2 may operate at a frequency of about 300,000 cycles per second, in which case the sequence of 10 cyclic comparisons will be made in 3 microseconds. If however, the analog input voltage from source 12 varies at a sufficiently fast rate so as to impair the accuracy of the analog-to-digital conversion, a sample-and-hold circuit may be provided between the analog voltage source 12 and the summing node point 11, synchronized with the timing circuit 48 so as to hold the sampled analog voltage at a constant value during each sequence of comparison cycles.

The rapid operation of the switch S1 would cause undesirable transient voltages to occur due to the presence of the stray capacitance 26. According to a feature of the invention, the chopper switch S2 is closed thus shorting out the stray capacitance 26 during the times of sampling by switch 53 and capacitor 38 and also during the setting intervals of the sections of switch S1. This prevents the occurrence of transient voltages which, if they did occur, could give false values of the comparison voltage inputs 34, 37 of the comparator 33.

While a preferred embodiment of the invention has been shown and described, various other embodiments and modifications thereof will become apparent to persons skilled in the art, and will fall within the scope of invention as defined in the following claims.

I claim:

1. An analog-to-digital conversion circuit comprising a summing node point, means for applying an analog signal to said summing node point, and successive approximation means to apply selected digital values to said summing node point in a sequence for causing the summing node voltage to approach a given value for determining the closest digital approximation to the analog value, wherein the improvement comprises a chopper switch device connected between said summing node point and a point of reference potential, an amplifier having an input connected to said summing node point, a comparator circuit having a first input connected to the output of said amplifier, a sample-and-hold circuit connected between said amplifier output and a second input of said comparator circuit, said sample-and-hold circuit being synchronized with said chopper switch device so as to sample when the chopper switch device is closed and held when the chopper switch device is open, and means connecting the output of said comparator circuit to said successive approximation means for effecting control thereof.

2. A circuit as claimed in claim 1, in which said amplifier is an AC amplifier.

3. A circuit as claimed in claim 1, in which said sample-and-hold circuit comprises a switch connected between said amplifier output and said second input of the comparator circuit, and a capacitor connected between said second input of the comparator circuit and a point of reference potential.

4. A circuit as claimed in claim 1, in which said analog signal is applied to said summing node point with a given electrical polarity, and in which said digital values are applied to said summing node point with an electrical polarity opposite that of said given polarity, whereby said closest digital approximation to the analog value is determined as the voltage at said summing node point approaches zero.